United States Patent [19]

Uchimura et al.

[11] Patent Number: 5,165,957
[45] Date of Patent: Nov. 24, 1992

[54] PROCESS FOR PRODUCING MULTILAYER WIRING STRUCTURE

[75] Inventors: Shun-ichiro Uchimura; Hiroshi Suzuki; Hidetaka Sato, all of Hitachi, Japan

[73] Assignee: Hitachi Chemical Company, Ltd., Tokyo, Japan

[21] Appl. No.: 593,309

[22] Filed: Oct. 4, 1990

Related U.S. Application Data

[63] Continuation of Ser. No. 318,480, Mar. 3, 1989, abandoned, which is a continuation of Ser. No. 376, Jan. 5, 1987, abandoned.

Foreign Application Priority Data

Jan. 7, 1986 [JP] Japan .................. 61-1129

[51] Int. Cl.$^5$ ............................ C23C 26/00
[52] U.S. Cl. ..................... 427/96; 427/407.1
[58] Field of Search ............... 427/96, 407.1

[56] References Cited

U.S. PATENT DOCUMENTS

| | | | |
|---|---|---|---|
| 3,037,966 | 6/1962 | Chow | 528/353 |
| 4,030,948 | 6/1977 | Berger | 148/33.3 |
| 4,347,306 | 8/1982 | Takeda | 427/96 |
| 4,528,216 | 7/1985 | Ogura | 427/96 |
| 4,568,601 | 2/1986 | Araps | 427/43.1 |
| 4,586,997 | 5/1986 | Lee | 427/82 |
| 4,603,195 | 7/1986 | Babich | 430/193 |
| 4,618,878 | 10/1986 | Aoyama | 357/4 |
| 4,654,223 | 3/1987 | Araps | 427/96 |
| 4,656,050 | 4/1987 | Araps | 427/96 |
| 4,699,803 | 10/1987 | Araps | 427/96 |
| 4,705,720 | 11/1987 | Kundinger | 428/349 |
| 4,871,619 | 10/1989 | Araps | 427/96 |

OTHER PUBLICATIONS

R. Cannizzaro "Applications of Polyimide Materials in Electronic Circuitry" Solid State Technology, Nov., 1969, pp. 31–38.

*Primary Examiner*—Shrive Beck
*Assistant Examiner*—Vi Duong Dang
*Attorney, Agent, or Firm*—Antonelli, Terry, Stout & Kraus

[57] ABSTRACT

A multilayer wiring structure produced by using a special poly(amic acid) ester oligomer for making an interlayer insulating film has an almost flattened surface without suffering from level differences of underlying wiring patterns.

5 Claims, 1 Drawing Sheet

F I G. 1
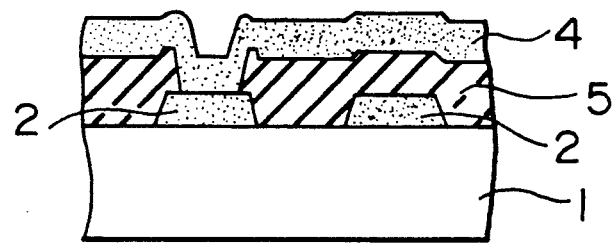
F I G. 2
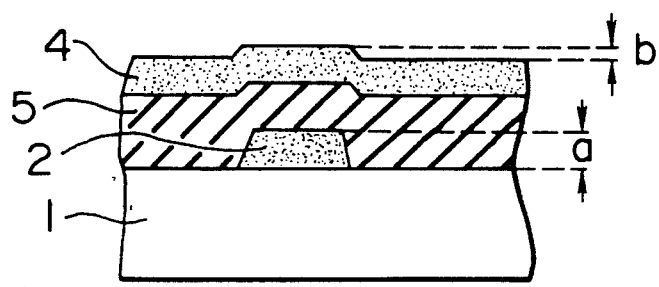
F I G. 3
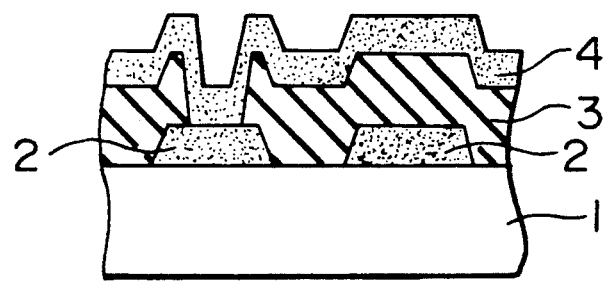

PROCESS FOR PRODUCING MULTILAYER WIRING STRUCTURE

This application is a continuation of application Ser. No. 07/318,480, filed Mar. 3, 1989 now abandoned, which is a continuation of Ser. No. 000,376, filed Jan. 5, 1987 now abandoned.

BACKGROUND OF THE INVENTION

This invention relates to a process for producing a multilayer wiring structure for use in electronic circuit parts such as semiconductor-base integrated circuits, bubble memories, and the like.

For the production of multilayer wiring structures in semiconductor-base integrated circuits and the like, there has hitherto been used a process which comprises forming an interlayer insulating film of $SiO_2$, SiN, or the like on a substrate supporting a patterned wiring layer, by a vapor growth method such as a vacuum deposition method, a CVD (chemical vapor deposition) method, or the like, and making through-holes in the substrate, followed by forming an upper wiring layer. However, the process comprising the formation of an interlayer insulating film by the vapor growth method has suffered from the following problem: As shown in FIG. 3 of the accompanying drawings, level differences of an underlying wiring layer 2 are retained as they are even after the formation of an interlayer insulating film 3, and when an upper wiring layer 4 is formed, its portions on steep sides of the above-mentioned level differences become extremely thin, which results in readily breaking the wiring. In FIG. 3, numeral 1 represents a substrate.

To solve this problem, there has been proposed and practically used a process which comprises forming an interlayer insulating film by applying a solution of a poly(amic acid) produced from an aromatic diamine and an aromatic tetracarboxylic dianhydride, and curing the applied poly(amic acid)(Japanese Patent Examined Publication No. 44871/76).

In recent years, however, the degree of integration in electronic parts including semiconductor-base integrated circuits is increased remarkably, the number of superposed wiring layers is also more multiplied, and thus the necessity of flatting the wiring level differences is further increasing. The above-mentioned poly(amic acid) produced from an aromatic diamine and an aromatic tetracarboxylic dianhydride has very low solubility even in solvents for poly(amic acid)s and consequently it is impossible to prepare concentrated solutions of this poly(amic acid). Therefore, the flatting of the above-mentioned wiring level differences is unsatisfactory with such a poly(amic acid) and multilayer wiring structures of two or more layers have been difficult to produce.

SUMMARY OF THE INVENTION

It is an object of the present invention to overcome the above noted drawback of the prior art, and to provide a process for producing a multilayer wiring structure of two or more superposed wiring layers improved in the flatness of the wiring level differences.

According to the invention, there is provided a process for producing a multilayer wiring structure, which comprises coating a poly(amic acid) ester oligomer obtained by reacting an aromatic diamine and/or a diaminosiloxane with an aromatic tetracarboxylic acid ester obtained by reacting an aromatic tetracarboxylic acid dianhydride with an alcohol and/or an alcohol derivative on a substrate having a pattern-formed wiring layer, curing the poly(amic acid) ester oligomer to form an interlayer insulating film, forming through-holes, and forming an upper wiring layer on the interlayer insulating film.

BRIEF DESCRIPTION OF THE DRAWINGS

FIG. 1 is a cross-sectional view of a multilayer wiring structure prepared in an example of the present invention.

FIG. 2 is a cross-sectional view similar to FIG. 1 for explaining a way of evaluating the degree of flatting the surface of an overlying wiring layer.

FIG. 3 is a cross-sectional view of a multilayer wiring structure according to an prior art process, wherein the interlayer insulating film is an $SiO_2$ film formed by a vapor growth method.

DESCRIPTION OF THE PREFERRED EMBODIMENTS

The present invention has been accomplished on the basis of finding that the higher the concentration of poly(amic acid) solution applied to a substrate supporting a patterned wiring layer becomes, the better the flatting rate of the level differences becomes, and that in order to make the concentration of poly(amic acid) solution higher, oligomerization of a low-molecular weight ester is effective.

In the present invention, the substrate supporting a patterned wiring layer means, for example, a silicon semiconductor base plate on which a patterned A( layer is formed or a ceramic hybrid base plate on which a patterned Cu wiring layer is formed.

The poly(amic acid) ester oligomer used in the present invention is prepared by reacting an aromatic tetracarboxylic dianhydride with an alcohol and/or with an alcohol derivative in the presence of a solvent as occasion demands, followed by reacting the obtained aromatic tetracarboxylic acid ester with an aromatic diamine and/or with a diaminosiloxane. If necessary in this case, the molecular weight of the poly(amic acid) ester oligomer can be regulated by using an aromatic tetracarboxylic dianhydride in combination with the aromatic tetracarboxylic acid ester. When an aromatic tetracarboxylic dianhydride is used jointly, either the amount of alcohol and/or alcohol derivative used in the preparation of the aromatic tetracarboxylic acid ester may be decreased below one equivalent to the aromatic tetracarboxylic dianhydride to leave a part of the dianhydride unreacted or some amount of the dianhydride may be newly added later at the reaction with an aromatic diamine and/or with a diaminosiloxane.

In view of the solubility of the oligomer and the prevention of the oligomer from foaming in the curing, it is desirable to react 1.5 to 2 moles of an alcohol and/or an alcohol derivative with 1 mole of an aromatic tetracarboxylic dianhydride.

Examples of the solvent used in case of need include solvents of ether glycol type, e.g. butyl Cellosolve and solvents of amide type, e.g. N-methyl-2-pyrrolidone, N,N-dimethylacetamide, N,N-dimethylformamide, and dimethylsulfoxide. These solvents may be used alone or in combination.

The aromatic tetracarboxylic dianhydride used in the present invention is represented by the formula:

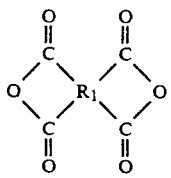

wherein $R_1$ is a tetravalent aromatic hydrocarbon radical. Such tetracarboxylic dianhydrides include, for example, 3,3',4,4'-benzophenonetetracarboxylic dianhydride, pyromellitic dianhydride, 3,3',4,4'-diphenyltetracarboxylic dianhydride, cyclopentanetetracarboxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, and 4,4'-sulfonyldiphthalic dianhydride. These dianhydrides may be used alone or in combination.

Suitable alcohols or alcohol derivatives for the esterification of the aromatic tetracarboxylic dianhydride include monohydric alcohols, e.g. methanol, ethanol, propanol, isopropanol, and butanol; polyhydric alcohols, e.g. ethylene glycol, propylene glycol, glycerol, and trimethylolpropane; Cellosolves; and carbitols. These may be used alone or in combination. An alcohol and an alcohol derivative can be used together.

Suitable aromatic diamines for use in the present invention is represented by the formula:

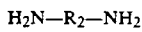

wherein $R_2$ is a divalent aromatic hydrocarbon radical. Such diamines include, for example, 4,4',-diaminodiphenyl ether, 4,4'-diaminodiphenylmethane, 4,4'-diaminodiphenyl sulfone, 4,4'-diaminodiphenyl sulfide, benzidine, m-phenylenediamine, 1,5-naphthalenediamine, and 2,6-naphthalenediamine. These diamines also may be used alone or in combination.

Suitable diaminosiloxanes for use in the invention are represented by the formula:

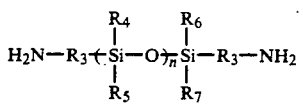

wherein $R_3$ is a divalent hydrocarbon radical of 1 to 10 carbon atoms; $R_4$, $R_5$, $R_6$, and $R_7$ are independently monovalent hydrocarbon radicals of 1 to 10 carbon atoms; and n is an integer of 1 to 10. Examples of the diaminosiloxanes are as follows:

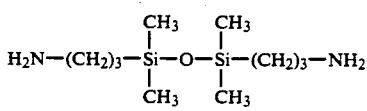

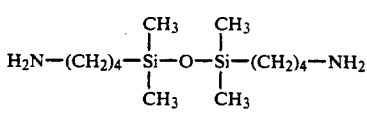

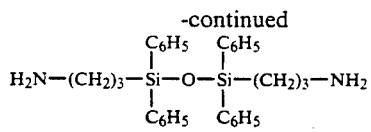

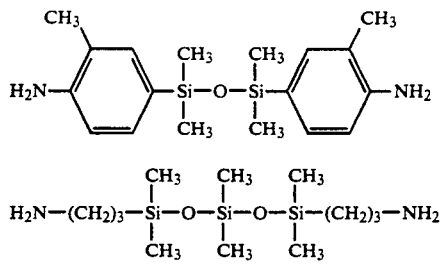

These also may be used alone or in combination with one another as well as with the above-cited aromatic diamines.

In the present invention, appropriate reaction temperatures for the esterification of the aromatic tetracarboxylic dianhydride vary with the solvent, alcohol, and alcohol derivative used. Though not particularly restricted, reaction temperatures of 80° to 150° C. are desirable, for instance, when 3,3',4,4'-benzophenonetetracarboxylic dianhydride in N-methyl-2-pyrrolidone is esterified with ethanol.

The reaction of the aromatic tetracarboxylic ester (+the aromatic tetracarboxylic dianhydride if necessary) with the aromatic diamine and/or with the diaminosiloxane is desirably carried out by using the tetracarboxylic ester in an amount (total amount of the ester and the dianhydride when this is used jointly) approximately equimolar to the diamine and/or the diaminosiloxane, for the purpose of maximizing the heat resistance of the polyimide resin formed by curing the resulting poly(amic acid) ester oligomer. The temperature of this reaction is desired to 90° C. at the highest because higher reaction temperatures induce the conversion of the resulting poly(amic acid) ester oligomer into a polyimide which, scarcely soluble, will precipitate.

The thus obtained poly(amic acid) ester oligomer solution is then coated by means of a spinner or a similar coater on a substrate overlaid previously with a patterned wiring layer, and is dried at a temperature of desirbly 100° to 200° C., preferably 120° to 180° C., for a period of desirably 1 to 2 hours. The dried coating is cured at a temperature of desirably 300° to 400° C., preferably 320° to 380° C., for a period of desirably 1 to 2 hours, thereby forming an interlayer insulating film of polyimide.

A resist pattern is formed on the thus formed interlayer insulating film by the ordinary photolithographic process, and through-holes are formed in the film at prescribed positions by a method such as wet etching with a hydrazine etchant or dry etching with an $O_2$ plasma.

Then the pierced interlayer insulating film is overlaid with an upper wiring layer by vacuum deposition, CVD, or the like, thereby making up a multilayer wiring structure of the invention.

A structure comprising more-multiplied wiring layers and insulating layers can be produced by patterning the upper wiring layer and repeating the above procedure.

The present invention is illustrated with reference to the following Examples and Comparative Example.

EXAMPLE 1 a. Preparation of Poly(amic acid) Ester Oligomer Solution 32.21 Gram of 3,3',4,4'-benzophenonetetracarboxylic dianhydride in 69.1 g of N-methyl-2-pyrrolidone was heated to 80° C., and 9.21 g of ethanol was added and reacted at 100° C. for 2 hr to form a solution of benzophenone-tetracarboxylic ester. To this solution was added 20.01 g of 4,4'-diaminodiphenyl ether and reacted at 80° C. for 3 hr. The thus obtained solution of poly(amic acid) ester oligomer was found to have a viscosity of 2 poises at 25° C.

b. Formation of Multilayer Wiring Layers

A silicon wafer on which an Al wiring pattern 1 μm thick and 1.0–5.0 μm wide had been formed by vacuum deposition followed by the ordinary photolithographic process was coated with the above solution of oligomer by means of a spinner operated at 3000 rpm/30 sec. The coating was dried at 150° C. for 1 hr, and cured at 350° C. for 1 hr to form an interlayer insulating film of polyimide. The thickness of the film was 2 μm. Then a resist pattern was formed thereon by the ordinary photolithographic process, and holes were made through the polyimide film by using an etching liquid composed of hydrazine and ethylenediamine.

Thereafter, an upper Al wiring layer was formed on the polyimide film, thus completing a multilayer wiring structure as shown in FIG. 1. In this drawing, 5 is the interlayer insulating film of polyimide and 1, 2, and 4 are the same as in FIG. 3.

The degree of flatting the lower-layer-wiring level difference was 90%, as determined from values of a and b shown in FIG. 2 according to the following equation:

$$\text{Degree of flatting} = \frac{a - b}{a} \times 100$$

EXAMPLE 2

32.21 Gram of 3,3',4,4'-benzophenonetetracarboxylic dianhydride in 69.1 g of N,N-dimethylformamide was heated to 80° C., and 8.29 g of ethanol was added and reacted at 100° C. for 2 hr to form a solution of benzophenonetetracarboxylic ester. To this solution were added 19.01 g of 4,4'-diaminodiphenyl ether and 0.74 g of 1,3-bis(3-aminopropyl)-1,1,3,3-tetramethyldisiloxane and reacted at 80° C. for 2 hr. The thus obtained solution of a poly(amic acid) ester oligomer containing siloxane bonds was found to have a viscosity of 3 poises at 25° C. Using this solution, a multilayer wiring structure provided with a 2 μm thick interlayer insulating film was formed in the same manner as in EXAMPLE 1. The found degree of flatting was 95%.

COMPARATIVE EXAMPLE 1

A multilayer wiring structure provided with a 2 μm thick interlayer insulating film was formed in the same manner as in EXAMPLE 1 but using a polyamic acid solution (concentration 15%, viscosity 10 poises) prepared from 3,3',4,4'-benzophenonetetracarboxylic dianhydride and 4,4'-diaminodiphenyl ether by the known process. The degree of flatting was about 30%, as determined in the same way as in EXAMPLE 1.

According to the present invention, the surfaces of overlying layers for wiring, in multilayer wiring structure, can be flattened nearly completely with interlayer insulating films without being affected adversely by projections of underlying wiring patterns. Thus, surface unevenness due to multiplied wiring layers can be removed and hence the reliability of wiring can be improved to a great extent.

What is claimed is:

1. A process for producing a multilayer wiring structure, which consists of the steps of coating a layer consisting of a poly(amic acid) ester oligomer obtained by reacting an aromatic diamine and/or a diaminosiloxane with an aromatic tetracarboxylic acid ester obtained by reacting an aromatic tetracarboxylic acid dianhydride with at least one of an alcohol and/or an alcohol derivative, on a substrate having a pattern-formed wiring layer, curing the poly(amic acid) ester oligomer to form an interlayer insulating film having heat resistance greater than that exhibited by a cured poly(amic acid) oligomer having vinyl and/or acetylenic end groups, forming through-holes and forming an upper wiring layer on the interlayer insulating film; 1.5 to 2 moles of the alcohol and/or alcohol derivative being reacted with 1 mole of the aromatic tetracarboxylic dianhydride and the aromatic diamine and/or diaminosiloxane and the aromatic tetracarboxylic acid dianhydride ester being reacted in approximately equal molar amounts whereby the multilayered wiring structure exhibits improved flatness of wiring level differences; said aromatic tetracarboxylic dianhydride being represented by the formula:

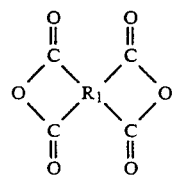

wherein $R_1$ is a tetravalent aromatic hydrocarbon radical; the alcohol and/or alcohol derivative is selected from the group consisting of methanol, ethanol, propanol, isopropanol, butanol, ethylene glycol, propylene glycol, glycerol, trimethylolpropane, cellusolve, carbitol and mixtures thereof; said aromatic diamine being represented by the formula:

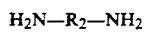

wherein $R_2$ is a divalent aromatic hydrocarbon radical and said diaminosiloxane being represented by the formula:

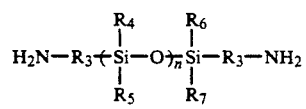

wherein $R_3$ is a divalent hydrocarbon radical of 1 to 10 carbon atoms, $R_4$, $R_5$, $R_6$ and $R_7$ are independently monovalent hydrocarbon radicals of 1 to 10 carbon atoms; and n is an integer of 1 to 10.

2. A process according to claim 1, wherein the steps of the formation of the interlayer insulating film, the formation of an upper wiring layer and the formation of through-holes are repeated at least one time.

3. A process according to claim 1, wherein the aromatic tetracarboxylic acid dianhydride is at least one dianhydride selected from the group consisting of 3,3',4,4'-benzophenonetetracarboxylic dianhydride, pyromellitic dianhydride, 3,3', 4,4'-diphenyltetracarboxylic dianhydride, cyclopentanetetracarboxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, and 4,4'-sulfonyldiphthalic dianhydride.

4. A process according to claim 3, wherein the aromatic diamine is at least one diamine selected from the group consisting of 4,4'-diaminodiphenyl ether, 4,4'-diaminodiphenylmethane, 4,4'-diaminodiphenylsulfone, 4,4'-diaminodiphenyl sulfide, benzidine, m-phenylenediamine, 1,5-naphthalenediamine, and 2,6-naphthalenediamine.

5. A process according to claim 4, wherein the diaminosiloxane is at least one diaminosiloxane selected from the group consisting of

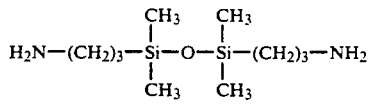

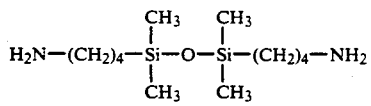

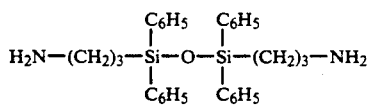

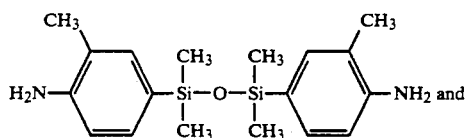

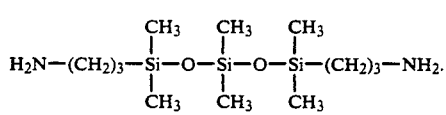

* * * * *